United States Patent
Ellsworth, Jr. et al.

(10) Patent No.: US 6,970,355 B2
(45) Date of Patent: Nov. 29, 2005

(54) FRAME LEVEL PARTIAL COOLING BOOST FOR DRAWER AND/OR NODE LEVEL PROCESSORS

(75) Inventors: Michael J. Ellsworth, Jr., Lagrangeville, NY (US); Bret W. Lehman, Raleigh, NC (US); Jason A. Matteson, Raleigh, NC (US); Roger R. Schmidt, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/300,615

(22) Filed: Nov. 20, 2002

(65) Prior Publication Data

US 2004/0095721 A1 May 20, 2004

(51) Int. Cl.[7] .................................................. H05H 7/20
(52) U.S. Cl. ....................... 361/694; 62/259.2; 174/15.1; 165/80.3; 165/80.4; 165/122; 165/701; 165/702; 454/184; 361/695; 361/699
(58) Field of Search ............................... 62/52.1, 259.2; 174/15.1; 165/80.4, 122, 80.3; 361/687–702; 454/184

(56) References Cited

U.S. PATENT DOCUMENTS

| | | | |
|---|---|---|---|
| 4,728,160 A | | 3/1988 | Mondor et al. |
| 5,144,531 A | * | 9/1992 | Go et al. .................... 361/702 |
| 5,251,095 A | | 10/1993 | Miller et al. |
| 5,261,243 A | * | 11/1993 | Dunsmore .................. 62/52.1 |
| 5,285,347 A | * | 2/1994 | Fox et al. .................... 361/699 |
| 5,323,847 A | * | 6/1994 | Koizumi et al. ........ 165/104.33 |
| 5,365,749 A | * | 11/1994 | Porter ........................ 62/259.2 |
| 5,412,534 A | | 5/1995 | Cutts et al. |
| 5,438,226 A | | 8/1995 | Kuchta |
| 5,460,441 A | | 10/1995 | Hastings et al. |
| 5,570,740 A | | 11/1996 | Flores et al. |
| 5,680,294 A | | 10/1997 | Stora et al. |
| 5,691,883 A | | 11/1997 | Nelson |
| 5,963,425 A | * | 10/1999 | Chrysler et al. ............ 361/695 |
| 5,986,882 A | | 11/1999 | Ekrot et al. |
| 5,999,365 A | | 12/1999 | Hasegawa et al. |
| 6,025,989 A | | 2/2000 | Ayd et al. |
| 6,086,476 A | | 7/2000 | Paquin et al. |
| 6,111,749 A | * | 8/2000 | Lamb et al. ................. 361/699 |
| 6,213,194 B1 | * | 4/2001 | Chrysler et al. ........... 165/80.3 |
| 6,422,304 B1 | * | 7/2002 | Slovikosky ................ 165/80.4 |

OTHER PUBLICATIONS

RD 261037, dated Jan. 10, 1986 (abstract only).

* cited by examiner

*Primary Examiner*—Gregory Thompson
(74) *Attorney, Agent, or Firm*—Lawrence D. Cutter

(57) ABSTRACT

A hybrid cooling system is provided which is particularly useful for cooling electronic circuit components disposed on circuit boards arranged in a plurality of drawers within a cabinet or frame. Air cooling is provided locally with a supplementary, auxiliary, or secondary cooling system being provided at more distant frame level locations. This configuration permits optimal sizing of the respective hybrid cooling system components without negatively impacting the coefficient of performance (COP). Hybrid heat sinks are employed to accommodate the hybrid cooling system design.

31 Claims, 7 Drawing Sheets

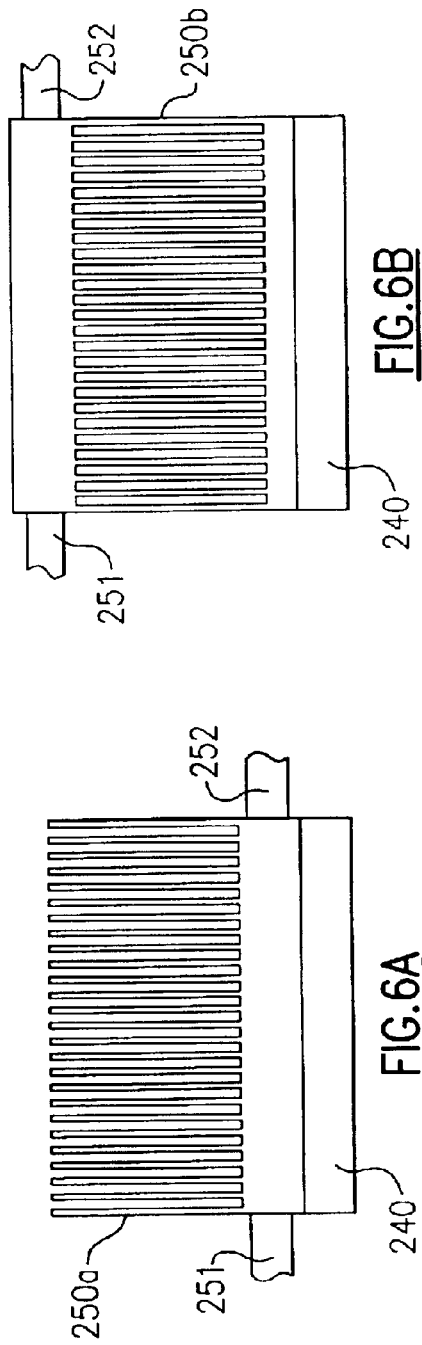
FIG.6A
FIG.6B
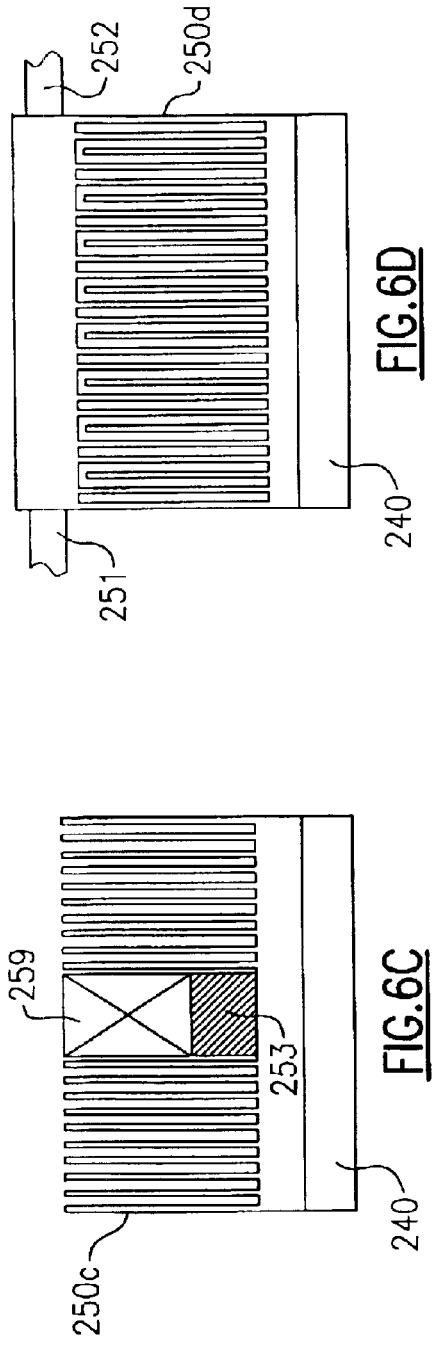
FIG.6D
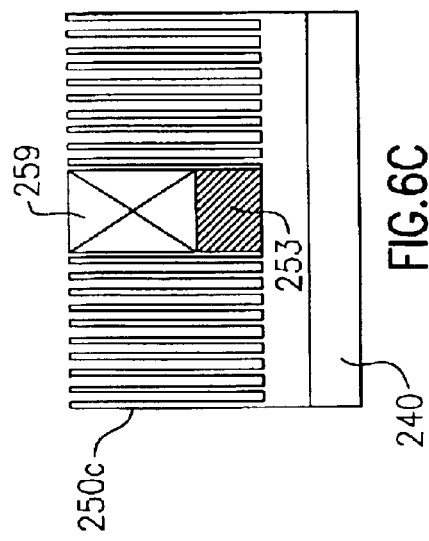
FIG.6C

FRAME LEVEL PARTIAL COOLING BOOST FOR DRAWER AND/OR NODE LEVEL PROCESSORS

BACKGROUND OF THE INVENTION

The present invention is generally directed to cooling systems for electronic circuit components. More particularly the present system is directed to a hybrid system employing air as a coolant which is functional up to a designed power dissipation level. Beyond the designed-for-power level dissipation point, an auxiliary boost cooling mechanism is employed. Since the auxiliary system is operative only when needed, its design and implementation is thus simplified so as to make the auxiliary cooling mechanism as small as possible in order to minimize the internal enclosure volume consumed by cooling system components which no longer end up displacing volume occupied by more desirable electronic system components. There are thus tradeoffs between closure size, circuit power dissipation level, and noise induced by the flow of cooling air which are positively influenced by the dual level cooling design of the present invention.

As circuit size has shrunk and as an increasing number of transistors have been incorporated into circuit chip design, the power density in terms of the heat that is to be removed has grown significantly. Higher operating frequencies have also contributed to the heat dissipation problem. It is also desirable to package such chips on cards and on boards and to include these packages in various electronic systems from which heat can be readily removed.

As the power which is to be removed from electronic systems has increased, there has been a corresponding need to increase the volume taken up within system housings by cooling components. With the number of transistors included on a chip doubling approximately every 18 months and with processors speed increasing at an even greater rate than this, it is seen that the heat dissipation problem is one that is currently difficult but which is also destined to be even more difficult in the future. In this regard, is also important to bear in mind that, when circuits operate at higher frequencies, the amount of power that they dissipate also increases. Accordingly, it is seen that a strategy which simply reduces the number of transistors per chip by keeping the same die size is not a viable solution to the problem because increases in operation frequency will also drive up heat dissipation requirements.

Even apart from the growing concern about the levels of thermal power which are dissipated by newer electronic circuit devices, there also exists the problem of defining the most efficient and cost effective mechanism for cooling. In particular, one of the objectives for newer cooling systems is the effective utilization of the existing volume that is available for the inclusion of cooling system components. As pointed out above, solving the problem of increased thermal dissipation by increasing the volume and size of the cooling system components is not desirable. Increasing the size of cooling system components only leads to increasing the size of electronics systems cabinets and/or such things as data processing nodes. However, increases in external dimensions are also an undesired element in systems design. Furthermore, increasing the volume occupied by cooling system components while keeping the enclosure or cabinet volume low only reduces the volume available for the more desirable electronic system components.

Along with all of the other concerns above, there is the desire to select and employ cooling system methodologies which exhibit the highest coefficient of performance (COP). In terms of COP, that is, air cooling provides significant levels of performance. Nonetheless, air cooling by itself has power dissipation limitations. Nonetheless, air cooling has several advantages in terms of cost and efficiency of operation. In a typical air cooling system the only moving part is an air moving device such as a fan, blower or other mechanism for directing air against cooling surfaces. However, in terms of its ability to carry away significant amounts of heat, air cooling has its limitations. It is further noted that limitations imposed by acoustic noise generation in air cooled systems provides another constraint in that additional air cooling capability is simply not desirable simply by increasing blower motor power or by increasing the rate of air flow measured in such units as cubic feet per minute (CFM). Nonetheless, in spite of the limitations of air cooling, particularly at high power levels, it is still seen as a desirable mechanism both in terms of cost and in terms of performance.

As pointed out above, air cooling has its limitations at high power levels. Accordingly, at higher power levels one is often forced to consider other cooling methods such as water cooled plates and refrigeration cooled plate systems. However, in general these systems tend to consume relatively high volumes of cabinet space within an electronic processing node or system. For this reason, these other cooling mechanisms also have their limitations.

Accordingly, it is seen that with the increased numbers of circuit components on electronic circuit chips and with increasing chip operating frequencies, the required degree of power dissipation is not only high but is also destined to grow to even higher levels. It is therefore seen that with the current state of knowledge, no single cooling method is a stand out in terms of meeting all of the desired cooling and electronic system constraints described above.

SUMMARY OF THE INVENTION

In accordance with a preferred embodiment of the present invention, a hybrid cooling system comprises an air cooling heat removal device in contact with a body or circuit chip to be cooled. An auxiliary heat removal mechanism is employed which has a first portion which is disposed adjacent to the object being cooled but which also includes a second portion which is disposed a certain distance away from the body or object. Additionally there is provided a mechanism for activating the auxiliary mechanism when it is detected that the air cooled heat removal device has reached its thermal capacity. In this way the auxiliary heat removal device may be provided with smaller dimensions. The auxiliary mechanism typically includes a material such as copper or aluminum for the removal of heat from the object up to a designed-for power level after which activation of the auxiliary heat removal mechanism is employed. In this way, the air cooled heat removal device is dimensioned to function up to a first thermal power level and the auxiliary heat removal is correspondingly dimensioned to operate to control a relatively smaller differential power level. In particular, the present invention provides an auxiliary heat removal mechanism which may be made relatively small so as to fit within desired package volumes. In this way the auxiliary heat removal mechanism intrudes minimally on standard packaging dimensions and form factors while at the same time providing a desired level of cooling when needed. In this regard, it is to be particularly noted that devices such as electronic data processing circuits are ones which often exhibit variable levels of power dissipation. However, the present invention provides an ability for designing and deploying high volume rate air cooling systems which occupy a major portion of that part of an internal enclosure devoted to cooling system components. The present invention also avoids the need to employ an air cooling mechanism for which acoustic noise would rise to unacceptable levels. The present invention employs a hybrid system with an auxiliary cooling mechanism which is dimensioned for operation within the relatively smaller differential power level range which occurs beyond the power dissipation levels designed for the primary air cooling system.

In accordance with another present invention, the above-described hybrid system is deployed in a device such as the data processing node within a walled enclosure. A plurality of circuit boards with electronic circuit chips are present in the enclosure and are in contact with air cooling heat removal devices such as a finned heat sink. There is provided at least one air moving device for directing a flow of air so as to contact the primary heat removal devices. An equal plurality of auxiliary heat removal mechanisms are employed in accordance with the hybrid system described above. These auxiliary heat removal mechanisms have a first portion which is in contact with the primary heat removal devices and second portion which is disposed away from the circuit chips. In this way the spacing between electronic circuit boards is not unnecessarily large since the first portions of the auxiliary heat removing devices are made relatively small since these devices need only be designed to handle differential excursions of the heat load. Again as above, means are provided for activating at least one of the auxiliary heat removal mechanisms when it is detected that the primary air cooled heat removal devices have reached their thermal capacity. This activation means typically includes a temperature sensor disposed in thermal contact with or in the vicinity of one or more of the electronic circuit chips or boards.

Accordingly, it is an object of the present invention to provide a cooling system for electronic circuit components which exhibits a high coefficient of performance (COP).

It is also an object of the present invention to provide a cooling system by combining cooling modes for air cooling and at least one other cooling modality.

It is also an object of the present invention to provide a cooling system package which promotes the situation in which system components are air cooled for most of the time and by employing auxiliary cooling systems are for less frequent, higher thermal excursions.

It is also an object of the present invention to provide high density packaging for processors and/or other electronic circuit equipment within a drawer, cabinet, node, or enclosure that is not as limited by the size of components employed in the cooling systems.

It is yet another object of the present invention to provide a hybrid cooling system which nonetheless exists in the form of a field replaceable unit (FRU).

It is also an object of the present invention to provide a hybrid cooling system without significantly impacting packaging dimensions or other form factors.

It is yet another object of the present invention to minimize the use of cooling techniques which exhibit lower coefficients of performance and particularly by doing so, to minimize physical volumes used for auxiliary cooling components.

It is a further object of the present invention to promote the most efficient cooling method at the drawer and/or node level until its limits are reached, but not to replace this efficient method with a less efficient method but instead to employ a cooling boost at the frame level to aid in the air cooling process.

It is still a further object of the present invention to provide an overall coefficient of performance which is higher than any methods provided by single cooling methodologies.

Lastly, but not limited hereto, it is an object of the present invention to provide efficient and integrated board level and frame level cooling systems having high efficiency and desirable volumetric and spacing factors.

The recitation herein of a list of desirable objects which are met by various embodiments of the present invention is not meant to imply or suggest that any or all of these objects are present as essential features, either individually or collectively, in the most general embodiment of the present invention or in any of its more specific embodiments.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

FIGS. 6A through 6B illustrate various configurations of air and liquid cooled heat sinks that may be employed in the present invention;

DETAILED DESCRIPTION OF THE INVENTION

Figure 1:
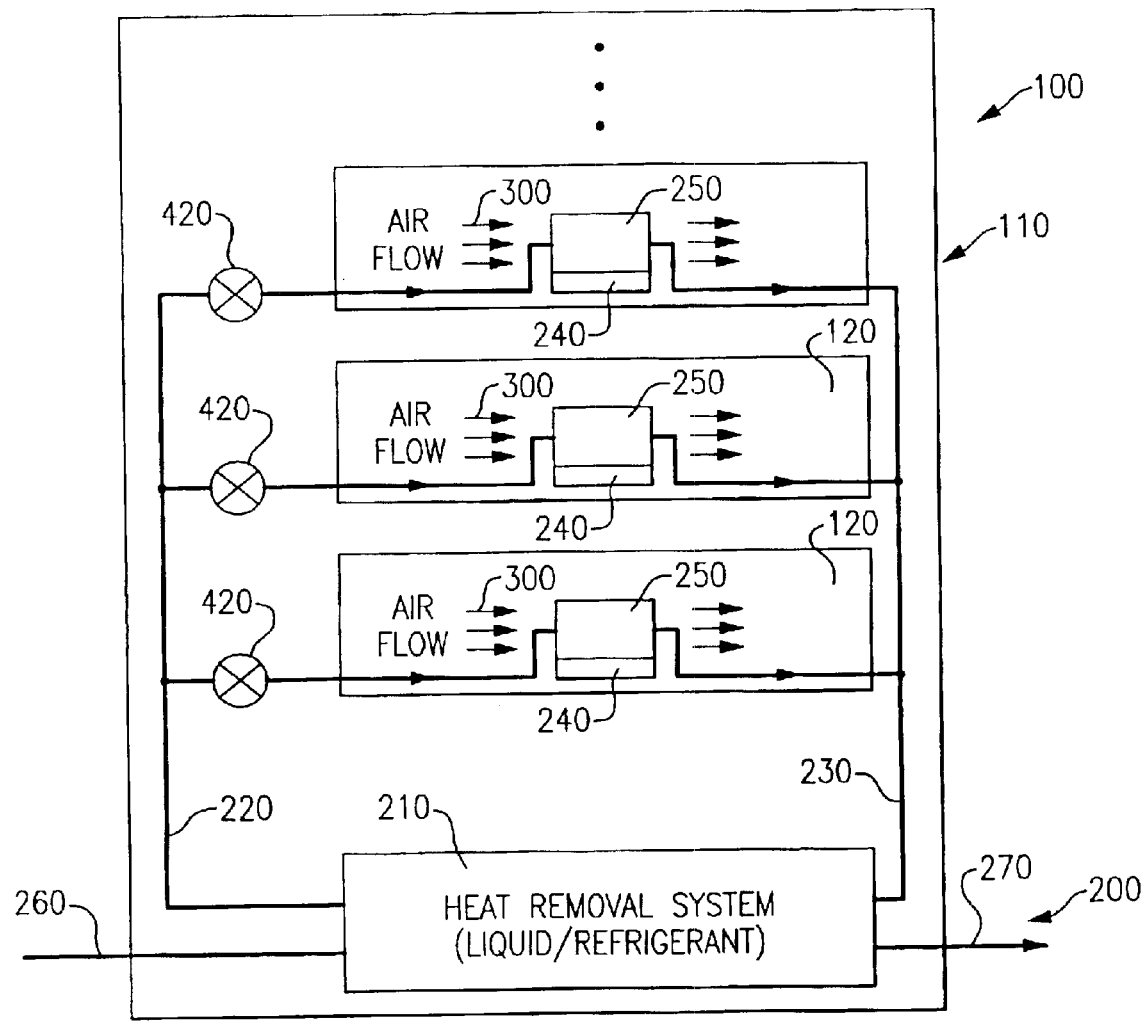
FIG. 1 is a schematic diagram illustrating the overall structure of the present invention including localized air flow and remote cooling system components.

FIG. 1 illustrates a preferred embodiment of the present invention. In particular, the present invention 100 includes drawers 120 disposed within a frame or stack 110. Frame 110 also preferably serves as a cabinet through which air flow is individually directed to hybrid heat sinks 250. In typical applications, hybrid heat sinks 250 are disposed in thermal contact with heat sources 240 which typically comprise electronic circuit chips such as a processor chip. Hybrid system 100 provides two forms of cooling. In a region or volume close to individual ones of heat sinks 250, air flow 300 is provided. In preferred embodiments of the present invention under normal operating conditions, it is anticipated that local air cooling is provided on a continuous basis with supplemental cooling being provided by means of auxiliary heat removal system 200. Auxiliary heat removal system 200 is disposed remotely from heat sources 240 and from heat sinks 250. Since it is anticipated that the bulk of the cooling capacity is to be carried by air flow cooling system 300 the component portions associated with auxiliary system 200 are therefore renderable as smaller volume components since they only have to be sized for differential thermal loads. In particular, auxiliary heat removal system 200 may comprise such things as a water cooled system or even a refrigerant cooled system. Additionally, hybrid heat removal system 200 may also include heat pipes in which the flow of a heat removal fluid takes place within the confines of a single conduit (heat pipe). In accordance with one embodiment of the present invention, heat removal system 200 is in fact a water cooled heat exchanger with cool water entering through conduit 260 and leaving system 200 via conduit 270, as show in FIG. 1. However, it is noted that preferred embodiments of the present invention provide entirely self contained, totally air-cooled systems. In these preferred embodiments, heat removal system 200 comprises a fluid to air heat exchanger. In even more preferred embodiments, the fluid is water. Also, as shown in FIG. 1, it is seen that the present invention contemplates the possibility that the various heat sources 240 and various ones of the drawers 120 may experience differing thermal loads and require varying degrees of supplemental or auxiliary cooling. Accordingly, for this purpose, input conduits 220 to hybrid heat sink 250 may be provided with individually controllable valves 420. These valves individually control supplemental cooling fluid directed to individual ones of heat sinks 250. Alternatively, it is noted that although less desirable, it is also possible that valves 420 be disposed within outflow conduits 230. In general, the cooling fluid controlled in this way is either water or refrigerant.

Figure 2:
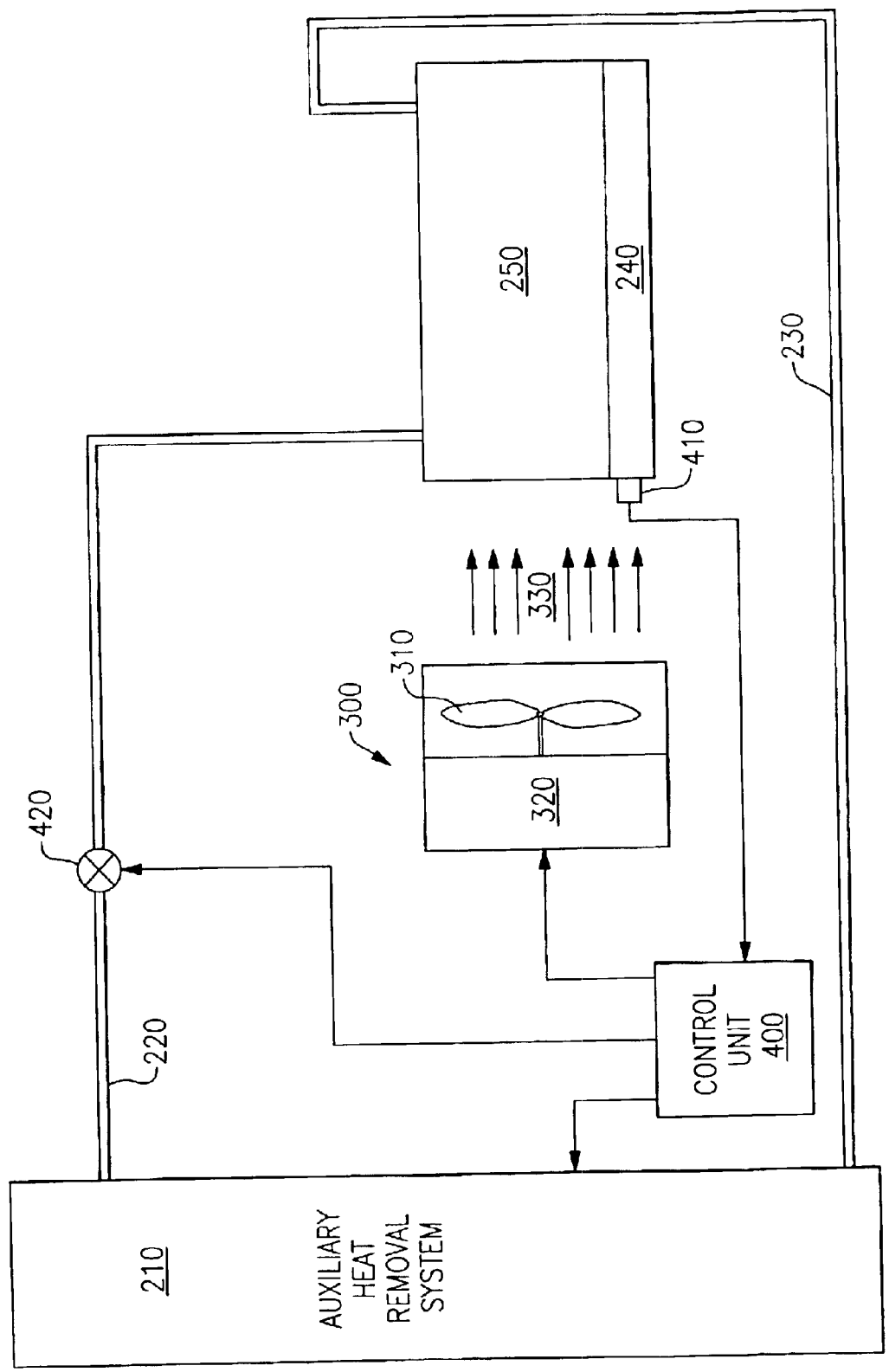
FIG. 2 is a schematic diagram illustrating the hybrid cooling aspects of the cooling system present invention as applied to a single heat source.

FIG. 2 illustrates the use of temperature sensor 410, or other thermal power sensing device used as a mechanism for controlling various aspects of hybrid or supplemental cooling as provided in the present invention. Sensing of thermal power levels is preferably provided by one or more temperature sensors. However, it is noted that there are also available other mechanisms for sensing thermal power levels, notably the amount of electric current being supplied to module 240. Current level sensing is particularly appropriate in those circumstances in which anticipatory temperature control is desired since there is always a finite time delay between an increase in current and the increase in temperature, especially sensed temperature. As power levels within heat source 240 are increased and are sensed, control unit 400 operates to turn on auxiliary heat removal system 210 at a predetermined temperature or power level. As shown in FIG. 2, auxiliary heat removal system 210 shows as being either a liquid or refrigerant based cooling system. On the other hand, in the event that the auxiliary cooling system 210 comprises a heat pipe, control unit 400 operates to increase the rate of removal of thermal energy from the end of the heat pipe that is not in proximity to heat source 240. It is also noted that as a first course of action in responding to increased power dissipation in heat source 240, control unit 400 may also initially operate to increase the flow of air 330 as driven by air moving device 310 as powered by device such as motor 320. However, as indicated above, increased noise levels, which are undesirable, limit the extent to which increased air flow provides a desirable solution to the problem of thermal excursions. In typical and preferrable modes of operation of the present invention, when sensor 410 provides an indication that the temperature levels within source 240 exceed a particular level, control unit 400 operates to open valve 420 and to activate the auxiliary or supplemental heat removal system 210. In liquid and refrigerant cooled systems this provides a flow of cooling fluid through conduit 220 into hybrid heat sink 250 and thence outwardly from heat sink 250 through conduit 230 back to heat removal system 210. In its simplest form, conrol unit 400 is a switch which responds to signals from sensor 410. It is also possible that control unit 400 and sensor 410 can be combined into a single device such as a temperature sensitive switch. In more complex embodiments, control 400 is a microprocessor which can embody any number of time and temperature sensitive control algorithms. In particular, it is noted that the control of valve 420 is not limited to on/off control mechanisms. A metered or partial coolant flow may also be employed particularly if finer temperature control is desired.

Most importantly, for proper understanding of the present invention, it should be appreciated that the bulk of the thermal load is carried by the air removal system which is disposed in relatively close proximity to heat source 240 and to heat sink 250. However, to accommodate power excursions, particularly transient excursions, heat sink 250 is adapted for connection to a secondary or auxiliary heat removal system. This is accomplished through conduits 220 and 230 which are designed to consume very little volume within frame 110. This is possible since they are designed to handle differential loads rather than the total task of heat dissipation. This also permits an auxiliary heat removal system (and particularly its local components) to be disposed at a distance from the heat source. It also permits the auxiliary heat removal system to be sized relatively small since it does not have to carry the majority of the thermal removal problem. This has the additional advantage that the overall coefficient of performance for the system is still maintained at a relatively high value.

It is also noted that with certain embodiments of the invention which do not necessarily include the utilization of control unit 400 and sensor 410, it is possible to employ an auxiliary heat removal system which operates on a constant basis in conjunction with the air flow removal system. This is something practical in those systems in which the power dissipation level is relatively constant and/or in which power excursions are either predictable or known ahead of time.

Figure 3:
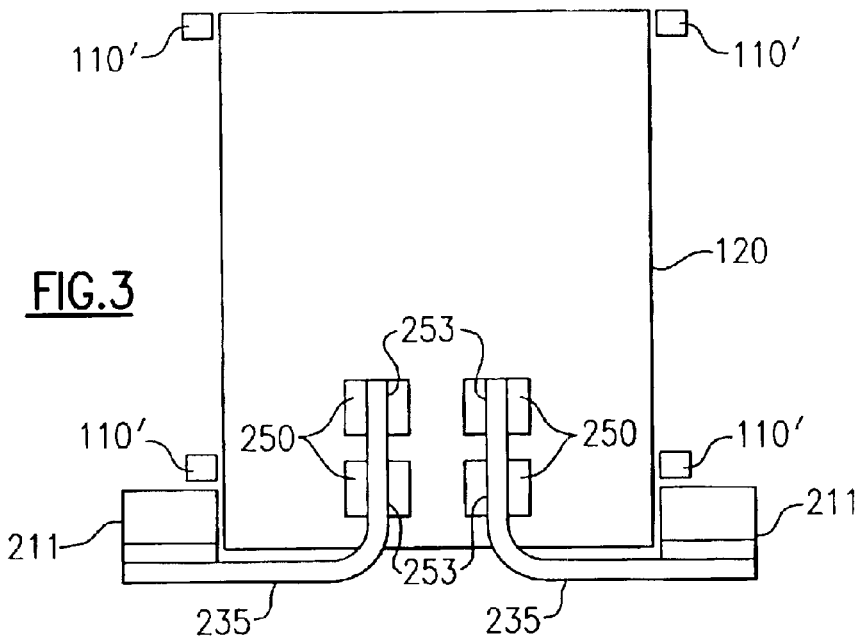
FIG. 3 is a top view of a drawer illustrating the one possible arrangement of heat pipe assemblies and processor modules.

FIG. 3 illustrates an embodiment of the present invention in which heat pipes 235 are employed as part of the non-local auxiliary heat removal system. In particular, FIG. 3 illustrates hybrid heat sink 250 (see also FIG. 9) in contact with heat pipe end portions 253. Not visible in FIG. 3 is the presence of heat sources 240 disposed below heat sinks 250 which in turn is disposed within frame 110'. In particular, FIG. 3 also illustrates the location of frame support members 110'. Not illustrated, for purposes of clarity, in FIG. 3 is the local air cooled portion of the heat removal system. Most notably with respect to FIG. 3, it is seen that heat pipe conduits 235 carry heat from heat sinks 250 to external and/or remote heat exchangers 211 which are shown schematically in FIG. 3. Heat exchangers 211 are part of the auxiliary heat removal system 210. As such they may include a cold plate structure or may comprise cooling rails extending vertically downward through the frame. In this latter regard, see FIG. 5. Thus, frame level cooling (as opposed to direct or local cooling) is provided by heat pipe 235 and heat exchangers or other cooling mechanism 211. See also FIG. 9.

Figure 4:
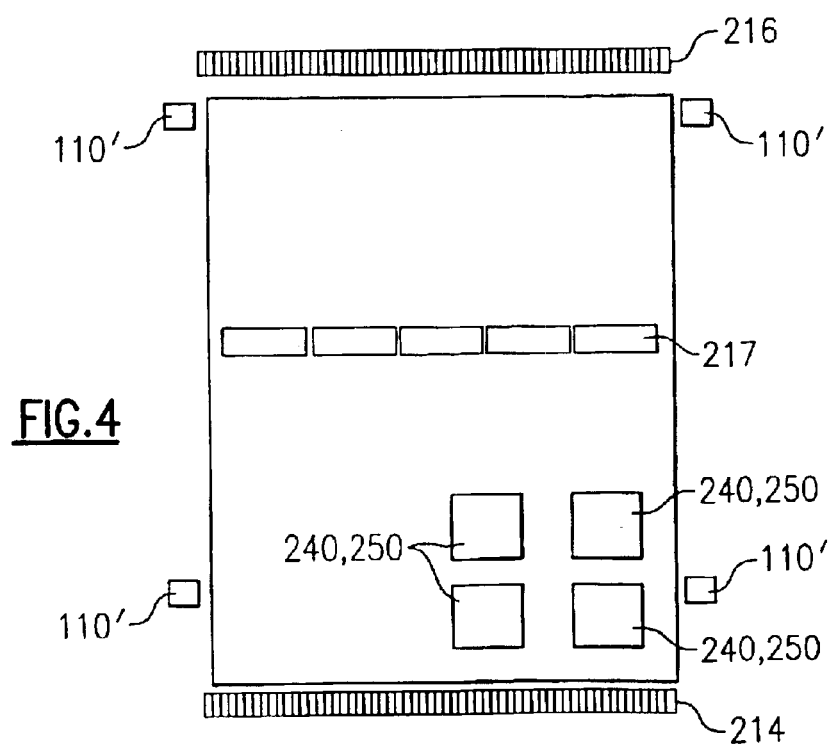
FIG. 4 is a top view similar to FIG. 3 but more particularly illustrating the placement of frame level condenser and evaporator units.

FIG. 4 provides a top view illustrating possible arrangements for using refrigeration to boost air cooling performance. Here, the air cooling aspect is augmented by utilizing the refrigeration system to remove heat from the air prior to the air removal of heat from processor modules 240, but only when desired to keep processor modules 240 within temperature specifications. This also illustrates a particularly cooperative relationship between primary and auxiliary heat removal systems. In this embodiment frame level evaporator 214 is provided along with frame level condenser 216. To provide air flow through evaporator 214 and likewise through condenser 216, air moving devices 217 are provided. In preferred embodiments a single, centrally disposed set of air moving devices is provided, as shown. Typically the function of air moving device or devices 217 is provided by a fan or fans. Processor modules 240, with their attendant heat sinks 250, are also depicted. The arrangement show in FIG. 4 provides chilled air as a first mechanism for cooling processor modules 240. In preferred embodiments of this aspect of the present invention, the refrigeration system is not operated unless the ambient air temperature rises above 25°. This helps to reduce and/or minimize energy usage. The placement and sizing of evaporator 214 and the placement and sizing of condenser 216 also provide a mechanism by which air flow can be directed in a longer, more diagonal flow path from one corner of the frame to the opposite corner. And, as noted above evaporator 214 and condenser 216 do not necessarily have to be positioned in the same air flow path. Additionally, it is noted that field replacement unit level maintenance is not inhibited by the inclusion of the additional. In particular, the design shown in FIG. 4 maintains the same heat sink design for the modules as is provided in other aspects of the present system. It is also noted that the use of chilled air allows for a 50% increase in processor heat load capability. The chilled air is thus providable as a side benefit of the employment of a refrigeration system as the auxiliary cooling device. The chilled air is provided by passage across and/or through evaporator 214.

Figure 5:
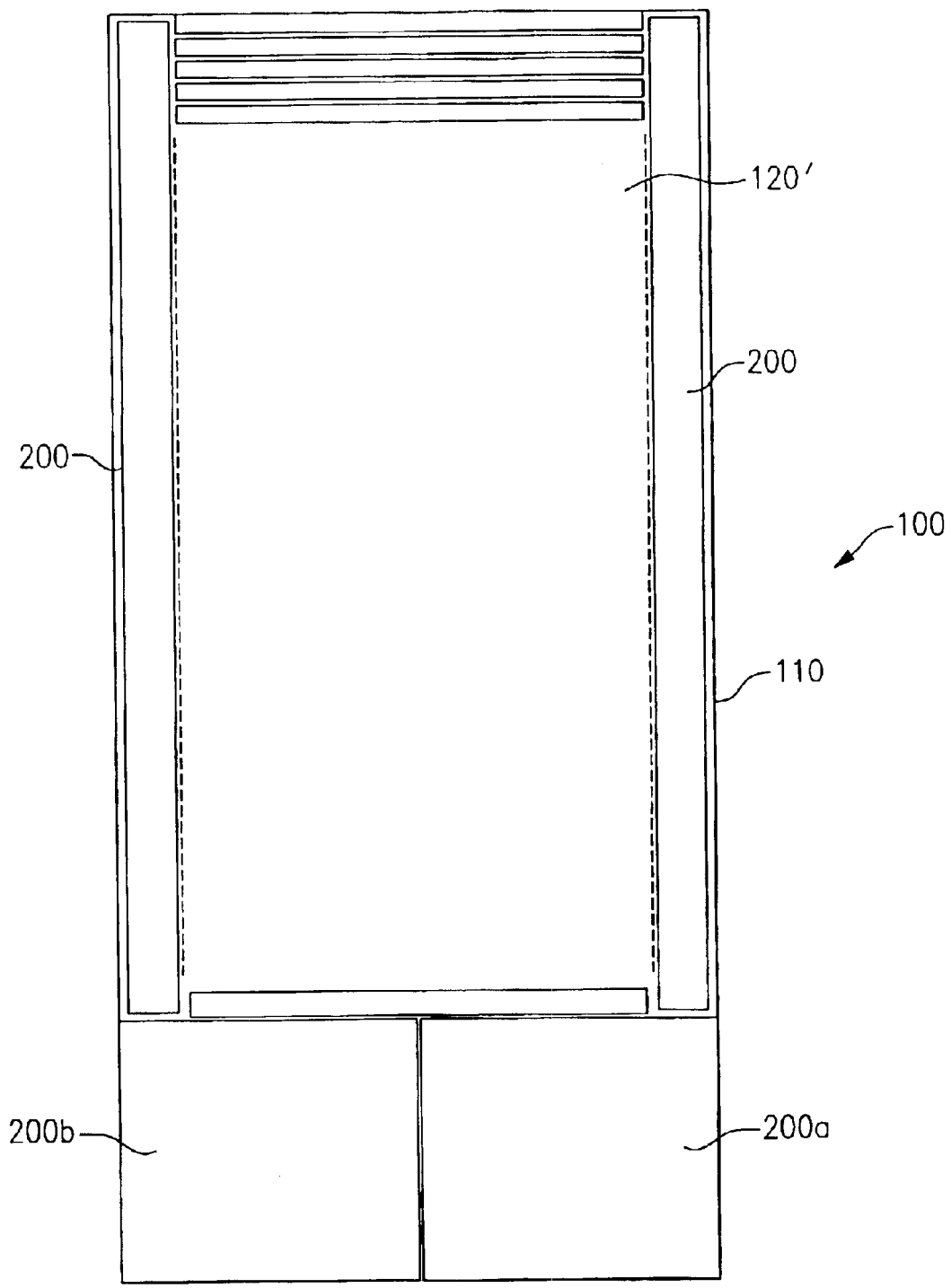
FIG. 5 is a front elevation view illustrating a cabinet frame in accordance with the present invention with redundant hybrid cooling units disposed at the base of a frame containing a plurality of removable drawers.

FIG. 5 is a combination of physical and schematic diagrams illustrating an overall configuration employable in the present invention. In particular, frame 110 includes drawers 120' (though not individually shown). Frame level boost cooling units 200a and 200b are seen disposed on opposite sides of frame 110. For example, in one embodiment reference numeral 200 in FIG. 5, refers to the location of heat pipe based heat exchangers as shown in FIG. 3. In another embodiment, reference numeral 200, would refer to the location of conduits 220 and 230 as seen in FIG. 1. Additionally, it is noted that the configuration shown in FIG. 5 is particularly amenable to the inclusion redundant frame level cooling units 200a and 200b located in the base of cabinet or frame 110.

Because of the hybrid nature of the proposed cooling system herein, modified designs are employed for heat sink 250. In particular, FIGS. 6A through 6D illustrate four different designs for heat sinks that are employable in the present invention (250a through 250d, with the design illustrated in FIG. 6B, namely 250b being the preferred embodiment). In the designs illustrated in FIGS. 6A, 6B, and 6D, conduits 251 and 252 for the flow of a cooling fluid are provided. Inlet and outlet conduits (or conduit connections) 251 and 252 are shown; however, it is noted that the operation of the subject heat sink does not depend upon which conduit is an inlet and which is an outlet. However, for purposes of better understanding of the present invention, it is assumed that conduit 251 is an inlet and is connected to conduit 220 as show in FIG. 1. Likewise, it may be assumed that conduit 252 is employed as an outlet port and is correspondingly connected to conduit 230 as shown in FIG. 1. It is noted that the cooling fluid employed in hybrid heat sink 250 may include a refrigerant.

In the heat sink design illustrated in FIG. 6A, it is noted that the portion of the heat sink through which coolant fluid flows is disposed immediately adjacent to heat source 240. In contrast, in the design shown in FIG. 6B, the hybrid heat sink is constructed so as to have the internal fluid flow portion disposed at the far end of the finned structure (that is, removal from heat source 240). The design illustrated in FIG. 6B is particularly appropriate for those circumstances in which the bulk of cooling is carried out by means of the primary, local air cooling mechanism. The hybrid heat sink illustrated in FIG. 6D illustrates a variation on the design shown in FIG. 6B. In particular, as a mechanism for balancing the amount of heat removed by the primary as opposed to the secondary cooling system, it is noted that not all of the fins in heat sink 250d extend to the heat sink portion through which coolant flows. Accordingly, in the heat sink design shown in FIG. 6D, it is the case that a proportionally greater amount of cooling is carried out by means of the primary, air cooling mechanism.

Lastly, FIG. 6C illustrates a heat sink design in which heat pipe portions are disposed between the fins and in a thermal contact with the base of the hybrid heat sink. See also FIG. 3 showing in greater detail the location of heat pipe portions 253 from a top view perspective. On top of heat pipe portion 253 and filling the volume between the fins there is preferably provided air flow block 259 which insures that the bulk of the air flow is directed to the volume between individual ones of the fines. It is also noted that with respect to the design illustrated in FIG. 6C that portion 253 could also constitute a liquid cold plate, an evaporator, or as referred to above, a heat pipe section. This element is in contact with a base or spreader portion of hybrid heat sink 250c. It is also noted that the base portion of the hybrid heat sink shown in all of the embodiments in FIG. 6 could include a base element, in contact with the electronics module, which comprises a vapor chamber, primarily for heat spreading purposes. Such chamber would be disposed between heat source 240 and heat sink 250.

Figure 7A:
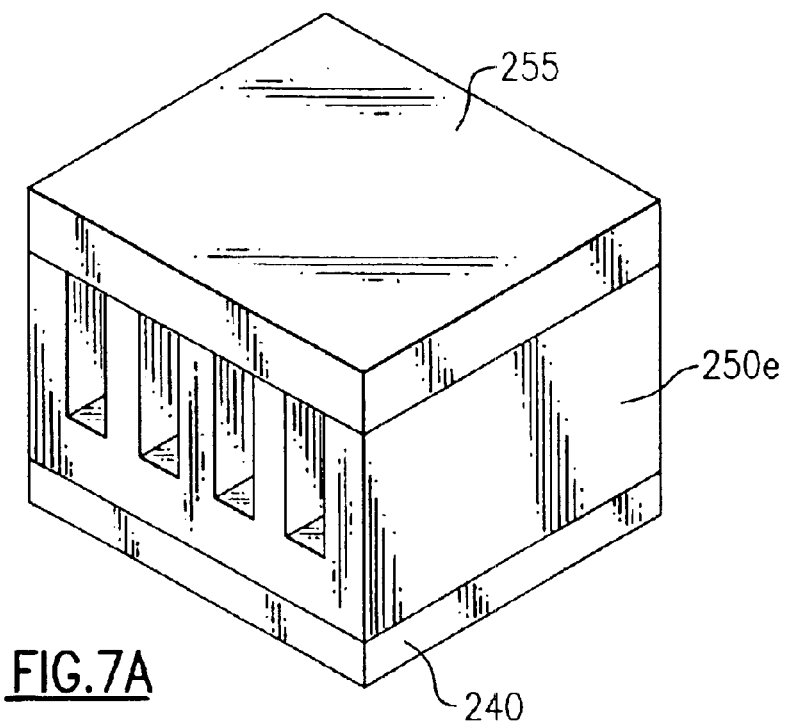
FIG. 7 is an isometric view of two heat sinks illustrating alternative arrangements for heat sink and fin and contact configurations.
Figure 7B:
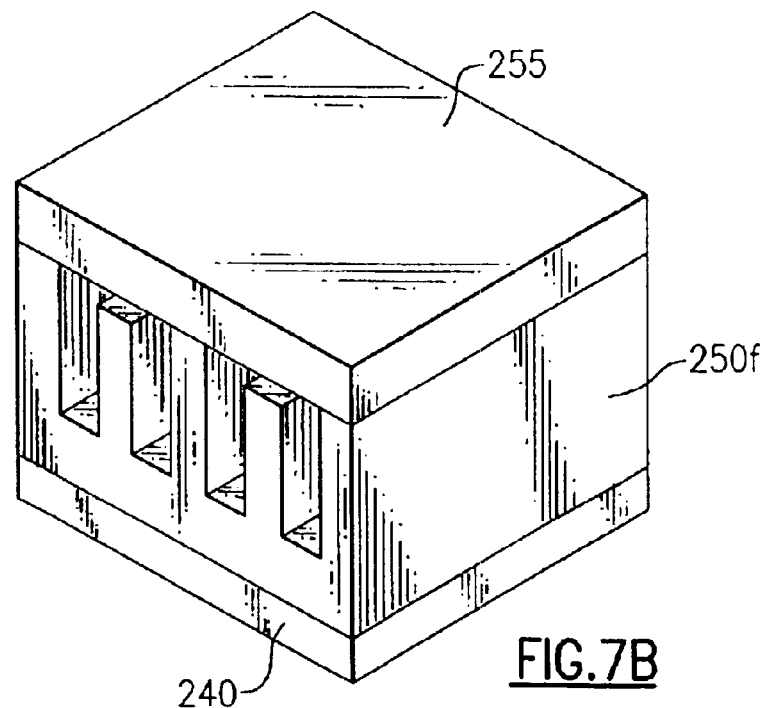

Along these same lines, yet another hybrid heat sink construction is illustrated in FIGS. 7A and 7B. In the heat sink embodiments illustrated therein, it is noted that upper portion 255 comprises an element such as a liquid cold plate or an evaporator. The lower portion, 250e or 250f comprise the air cooled based portions of the hybrid heat sink. FIG. 7B is similar to FIG. 6D in that it represents a hybrid heat sink design in which the balance is tilted more toward air cooling. These figures also illustrate the fact that hybrid heat sinks employed in conjunction with the present invention may be formed from non-integral components, thus making manufacturing easier.

Figure 8:
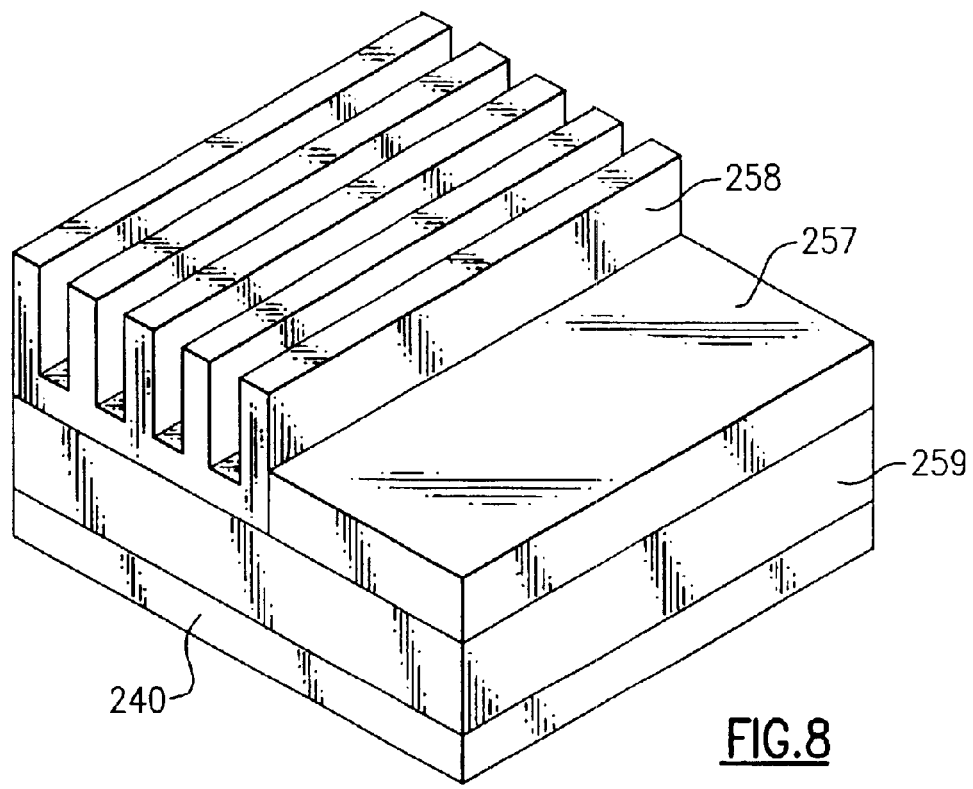
FIG. 8 is an isometric view which illustrates the fact that air and auxiliary cooling does not have to be applied to the same portion of the chip (or other heat source)

FIG. 8 illustrates yet another hybrid heat sink embodiment. The design illustrated in FIG. 8 is particularly suited for those situations in which the electronics module or other heat source 240 evinces differing thermal generative capabilities on different portions of its surface. Even more particularly in FIG. 8, it is noted that vapor chamber 259 may be disposed between a combination air cooled heat sink 258 and a liquid cooled cold plate or evaporator 257. The use of vapor chamber or heat spreader 259 is also particularly useful in those circumstances in which there are no "hot spots" on the surface of module 240 but is instead used as a mechanical mechanism for incorporating the hybrid air cooled and liquid cooled aspects of a hybrid heat sink. Inlets and outlets for liquid coolant or refrigerants for cold plate 257 are not visible in FIG. 8, but are the same form and variety as illustrated elsewhere herein.

Figure 9:
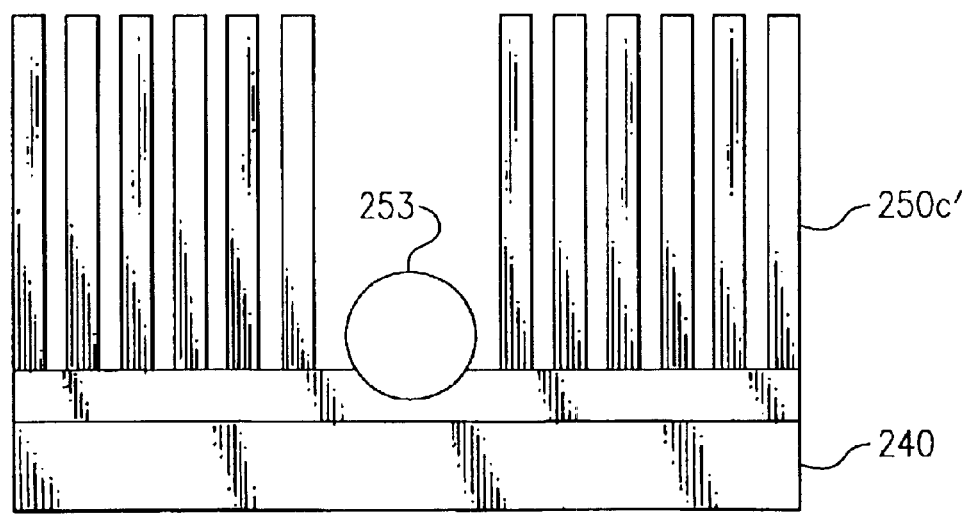
FIG. 9 is a side elevation view of a heat sink in accordance with the present invention in which a heat pipe is employed as part of the hybrid cooling system.

FIG. 9 illustrates yet another hybrid heat sink structure showing a heat pipe portion 253 in contact with the base of hybrid heat sink 250c'. Use of a heat sink as shown in FIG. 9 preferably occurs in conjunction with frame level evaporators or frame level water cooled cold plates disposed at the other end of the heat pipe element shown, for example, in FIGS. 3 and 6C.

From the above, it should be appreciated that an advantage of the hybrid cooling system design of the present invention is that it provides a mechansim for minimizing the volume required by frame level boost cooling system and permits continued use of current air cooling technologies for the various individual drawers. For example, a module which dissipates approximately 150 watts may have 100 watts of thermal energy removed by an air cooled finned heat sink, mounted on module while 50 watts of thermal energy is dissipated at the frame level through an enhanced air cooled, water cooled, or refrigeration system located in a small package disposed at a distance from the module level heat source such as at the bottom of the frame, as seen in FIG. 5.

From the above, it should be appreciated that the various embodiments of the present invention, either jointly or severably, satisfy the objects set forth above. In particular, it is seen that the present invention provides a hybrid cooling system which reduces and/or minimizes the volume occupied by cooling system components without significantly impacting the overall coefficient of performance.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A hybrid cooling system for cooling a body, said system comprising:
an air cooled heat sink, having an inlet and an outlet for providing fluid flow through said heat sink, said heat sink being in thermal contact with said body;
an auxiliary heat removal mechanism which includes said heat sink as a first portion and which also includes a second portion disposed away from said body, said first and second portions being connected via conduits connected to said inlet and to said outlet, for transporting cooling fluid; and
means for activating said auxiliary heat removal mechanism so as to provide fluid flow through said conduits and said heat sink upon detection of the condition that said air cooled heat sink has reached its thermal capacity.

2. The system of claim 1 further including air moving means for directing air against said heat sink.

3. The system of claim 1 in which said heat sink comprises a finned heat sink.

4. The system of claim 3 in which said heat sink comprises material selected from the group consisting of copper and aluminum.

5. The system of claim 1 in which said body comprise at least one electronic circuit chip.

6. The system of claim 5 in which said at least one chip is mounted on a circuit board.

7. The system of claim 6 in which said circuit board is disposed within a walled enclosure.

8. The system of claim 7 in which the second portion of said auxiliary heat removal mechanism is disposed within said enclosure.

9. The system of claim 7 in which the second portion of said auxiliary heat removal mechanism is disposed at least partially outside of said enclosure.

10. The system of claim 1 in which said air cooled heat sink possesses dimensions and material heat transfer properties for removal of heat from said body up to a first power level and in which activation of said auxiliary heat removal mechanism occurs upon heat dissipation by said body exceeding said first power level, whereby said air cooled heat sink is dimensioned to operate optimally up to said first power level and the first portion of said auxiliary heat removal mechanism is dimensioned to operate optimally for smaller power levels above said first level.

11. The system of claim 1 in which said body is capable of exhibiting variable thermal output.

12. The system of claim 1 in which the second portion of said auxiliary heat removal mechanism comprises a refrigeration device.

13. The system of claim 1 in which the second portion of said auxiliary heat removal mechanism comprises a liquid to air heat exchanger.

14. The system of claim 1 in which the second portion of said auxiliary heat removal mechanism comprises a fluid cooled cold plate.

15. The system of claim 14 in which said fluid is water.

16. The system of claim 14 in which said fluid cooled cold plate is in thermal contact with a heat exchanger.

17. The system of claim 16 in which said heat exchanger is air cooled.

18. The system of claim 1 in which said activating means includes a temperature sensor.

19. A coolable electronic system, said system comprising:
a walled enclosure;
a plurality of circuit boards having electronic circuit chips affixed thereto, said circuit boards being disposed within said enclosure;
an equal plurality of air cooled heat sinks having inlets and outlets for providing fluid flow through respective ones of said heat sinks, said heat sinks being in thermal contact with said chips;
at least one air moving device for directing air against at least one of said heat sinks;
an auxiliary heat removal mechanism, which includes said heat sinks as respective first portions thereof and a second portion disposed away from said chips, said first and second portions respectively being connected via conduits for transporting cooling fluid; and
means for selectively providing fluid flow through at least one of said respective conduits connected to at least one of said heat sinks upon detection of the condition that at least one of said air cooled heat sinks has reached its thermal capacity.

20. The system of claim 19 in which said second portion of said auxiliary heat removal mechanism includes a cold plate with fluid passages therein.

21. The system of claim 19 further including valves for selectively controlling fluid flow through said conduits.

22. The system of claim 19 in which said second portion of said auxiliary heat removal mechanism comprises a cold plate that is in thermal contact with an air coolable heat exchanger.

23. The system of claim 22 further including a second air moving device for directing air flow for against said air coolable heat exchanger.

24. The system of claim 23 in which said second air moving device and said air coolable heat exchanger are disposed within said enclosure.

25. The system of claim 22 in which said air coolable heat exchanger is disposed within said enclosure.

26. The system of claim 20 in which said cold plate passages are connected to a source of cooling liquid external to said enclosure.

27. The system of claim 26 in which said liquid is water.

28. The system of claim 19 in which said air cooled heat sinks possess dimensions and material heat transfer properties for removal of heat from said chips up to a first power level and in which said means for providing fluid flow is activated upon heat dissipation by at least some of said chips exceeding said first power level, whereby said air cooled heat sinks may be dimensioned to operate optimally up to said first power level and said auxiliary heat removal mechanism may be dimensioned to operate optimally for smaller power levels above said first level than would otherwise be needed if said auxiliary heat removal structure were also required to remove thermal energy below said first power level as well.

29. A hybrid cooling system for cooling a body, said system comprising:
- an air cooled heat sink, having an inlet and an outlet for providing fluid flow through said heat sink, said heat sink being in thermal contact with said body;
- an auxiliary heat removal mechanism which includes said heat sink as a first portion and which also includes a second portion disposed away from said body, said first and second portions being connected via conduits, connected to said inlet and to said outlet, for transporting cooling fluid; and
- means for activating said auxiliary heat removal mechanism so as to provide fluid flow through said conduits and said heat sink upon sensing a temperature condition which exceeds a threshold.

30. A coolable electronic system, said system comprising:
- a walled enclosure;
- a plurality of circuit boards having electronic circuit chips affixed thereto disposed within said enclosure;
- an equal plurality of air coolable primary heat sinks in thermal contact with said chips;
- at least one air moving device for directing a flow of air for contact with said primary heat sinks;
- an equal plurality of auxiliary heat removal mechanisms having first portions in thermal contact with said chips and second portions disposed away from said chips, said first and second portions being connected via a conduit for transporting cooling fluid; and
- means for activating at least one of said auxiliary heat removal mechanisms upon detection of the condition that at least one of said air cooled heat sinks has reached its thermal capacity.

31. A coolable electronic system, said system comprising:
- a walled enclosure;
- a plurality of circuit boards having at least one electronic circuit chip affixed thereto, said circuit boards being disposed within said enclosure;
- an equal plurality of air cooled heat sinks having inlets and outlets for providing fluid flow through respective ones of said heat sinks, said heat sinks being in thermal contact with circuit chips on one of said circuit boards;
- at least one air moving device for directing air against at least one of said heat sinks;
- an auxiliary heat removal mechanism, which includes said heat sinks as respective first portions thereof in thermal contact with a thermal spreader disposed between said chips and said heat sinks, said first and second portions being connected via a conduit for transporting cooling fluid; and
- means for selectively providing fluid flow through at least one of said respective conduits connected to at least one of said heat sinks upon detection of the condition that at least one of said air cooled heat sinks has reached its thermal capacity.

* * * * *